United States Patent [19]
Chang et al.

[11] Patent Number: 6,133,084
[45] Date of Patent: Oct. 17, 2000

[54] METHOD OF FABRICATING STATIC RANDOM ACCESS MEMORY

[75] Inventors: Ting-Chang Chang; Po-Sheng Shih, both of Hsinchu, Taiwan

[73] Assignee: United Microelectronics Corp., Taiwan

[21] Appl. No.: 09/318,236

[22] Filed: May 25, 1999

[51] Int. Cl.[7] .............................................. H01L 21/8244
[52] U.S. Cl. ...................... 438/238; 438/385; 438/528
[58] Field of Search .................................... 438/238, 275, 438/279, 383, 385, 528, 532

[56] References Cited

U.S. PATENT DOCUMENTS

| | | | |
|---|---|---|---|
| 4,837,173 | 6/1989 | Alvis et al. | 438/528 |
| 5,739,056 | 4/1998 | Dennison et al. | 438/238 |
| 5,879,971 | 3/1999 | Witek | 438/238 |

*Primary Examiner*—Chandra Chaudhari
*Attorney, Agent, or Firm*—Martine Penilla & Kim, LLP

[57] ABSTRACT

A method of fabricating a static random access memory. A gate oxide layer is formed on a substrate having active regions of an access transistor and a drive transistor. A Polysilicon layer is formed on the gate oxide layer. A germanium implantation is performed on the polysilicon layer of the active region of the drive region to form a polysilicon germanium layer. Thereafter, the polysilicon layer and the polysilicon germanium layer are patterned to form a poly gate and a polysilicon germanium gate on the active regions of the access transistor and the drive transistor. A lightly doped region is formed in the substrate beside the gates. A spacer is then formed on the sidewall of the gates. A heavily doped region is formed in the substrate beside the spacer.

10 Claims, 4 Drawing Sheets

METHOD OF FABRICATING STATIC RANDOM ACCESS MEMORY

BACKGROUND OF THE INVENTION

1. Field of the Invention

The invention relates to a method of fabricating a static random static memory (SRAM), and more particularly to a method of fabricating a drive transistor for an SRAM.

2. Description of the Related Art

Random access memory (RAM) including SRAM and dynamic random access memory (DRAM) is one kind of volatile memory. SRAM uses the "on" or "off" status of its transistors to store information, while selective charge or discharge of each capacitor in the cell decides data storage for a DRAM. Generally, SRAM is characterized by high speed operation, low power consumption and simple operation, and also has advantages of easy layout and low refresh frequency when compared with DRAM.

FIG. 1 shows a circuitry diagram of an SRAM cell including a CMOS. This SRAM cell includes two load transistors UT1, UT2, two drive transistors DT1, DT2, and two access transistors AT1, AT2. The gates of access transistors AT1, AT2 are controlled by the word line (WL) and the drains thereof are connected to the bit line The access transistors AT1, AT2 have to be turned on when a read operation is performed in an SRAM. In order to avoid the loss of data in the memory cell due to the read operation, the current drive capability of the drive transistors DT1, DT2 must be larger than that of the access transistors AT1, AT2. Therefore, the width/length ratio of the gate of the drive transistors DT1, DT2 must be larger than that of the access transistors AT1, AT2 in conventional technology so as to satisfy the requirements above.

However, when the capacity of the memory becomes larger and the size of the transistor becomes smaller, the thickness of the gate becomes thinner, resulting in a gate depletion effect. The gate depletion effect causes the efficient capacitance to become smaller and the current drive capability of the transistor to become smaller. As a result, the performance of the SRAM is reduced.

SUMMARY OF THE INVENTION

This invention therefore provides a method of fabricating SRAM, thereby preventing the gate depletion effect of the gate of the drive transistor and enhancing the current drive capability.

This invention therefore provides a method of fabricating SRAM by which the current drive capability of the drive transistor is larger than that of the access transistor.

To achieve these objects and advantages, and in accordance with the purpose of invention, as embodied and broadly described herein, the invention is directed towards a method of fabricating an SRAM. Active regions of a drive transistor and an access transistor are defined on a substrate. A gate oxide layer and a polysilicon layer are successively formed on the substrate. A germanium implantation is performed on the polysilicon layer of the active region of the drive transistor to transform a portion of the polysilicon layer into a silicon germanium layer. A poly gate and a polysilicon germanium layer gate are formed on the active regions of the access transistor and the drive transistor respectively. A lightly doped region serving as an offset region is formed in the substrate beside the gates, a spacer is formed on the sidewall of the gate and a heavily doped region is formed in the substrate beside the spacer. The subsequent processes to fabricate the SRAM are performed by conventional technology.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
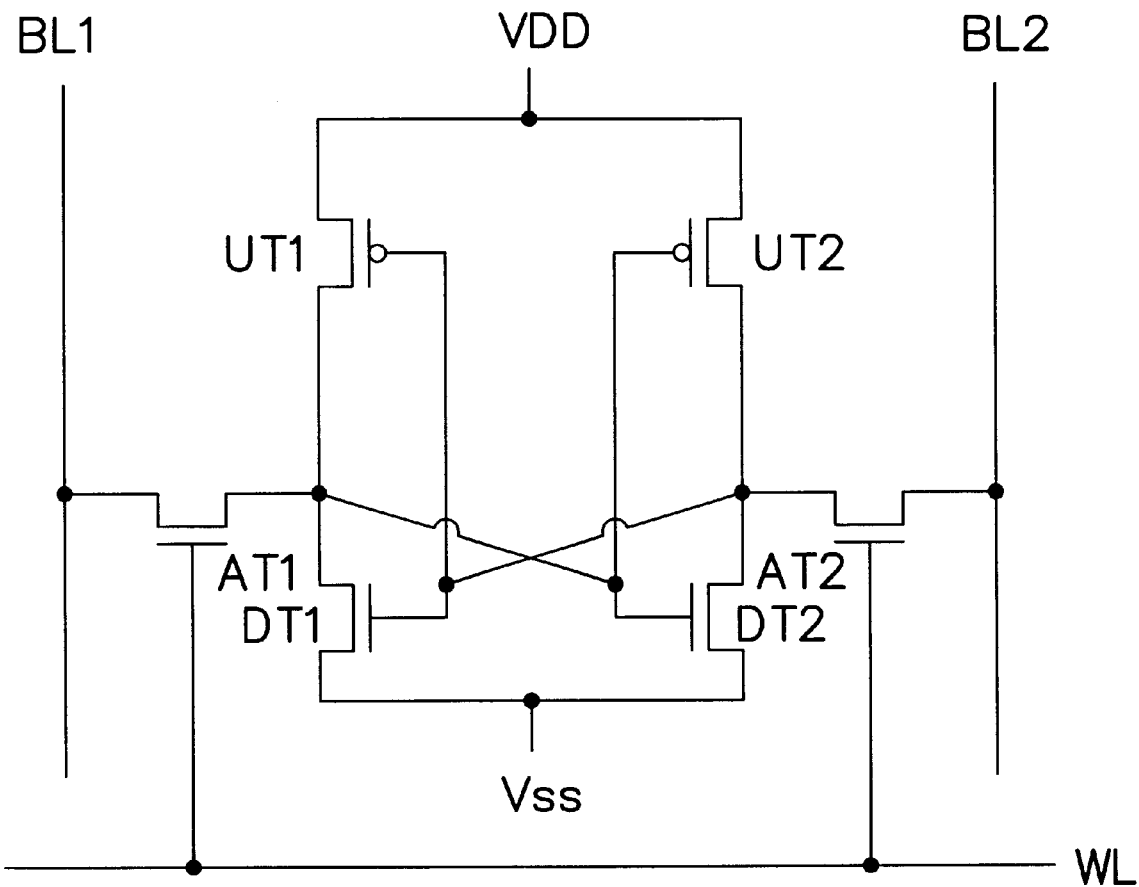
FIG. 1 shows a circuitry diagram of an SRAM with a CMOS.

Reference will now be made in detail to the present preferred embodiments of the invention, examples of which are illustrated in the accompanying drawings. Wherever possible, the same reference numbers are used in the drawings and the description to refer to the same or like parts.

Polysilicon germanium has favorable electrical properties, such as lower sheet resistance, higher dopant activation rate and tunable work function of its advantages. A gate made from polysilicon germanium is more capable of lessening a gate depletion effect than poly gate is. Therefore, a polysilicon germanium gate is used as a gate of the drive transistor in this invention, and as a result, the gate depletion effect is lessened and a higher current drive is provided in the drive transistor.

Figure 2:
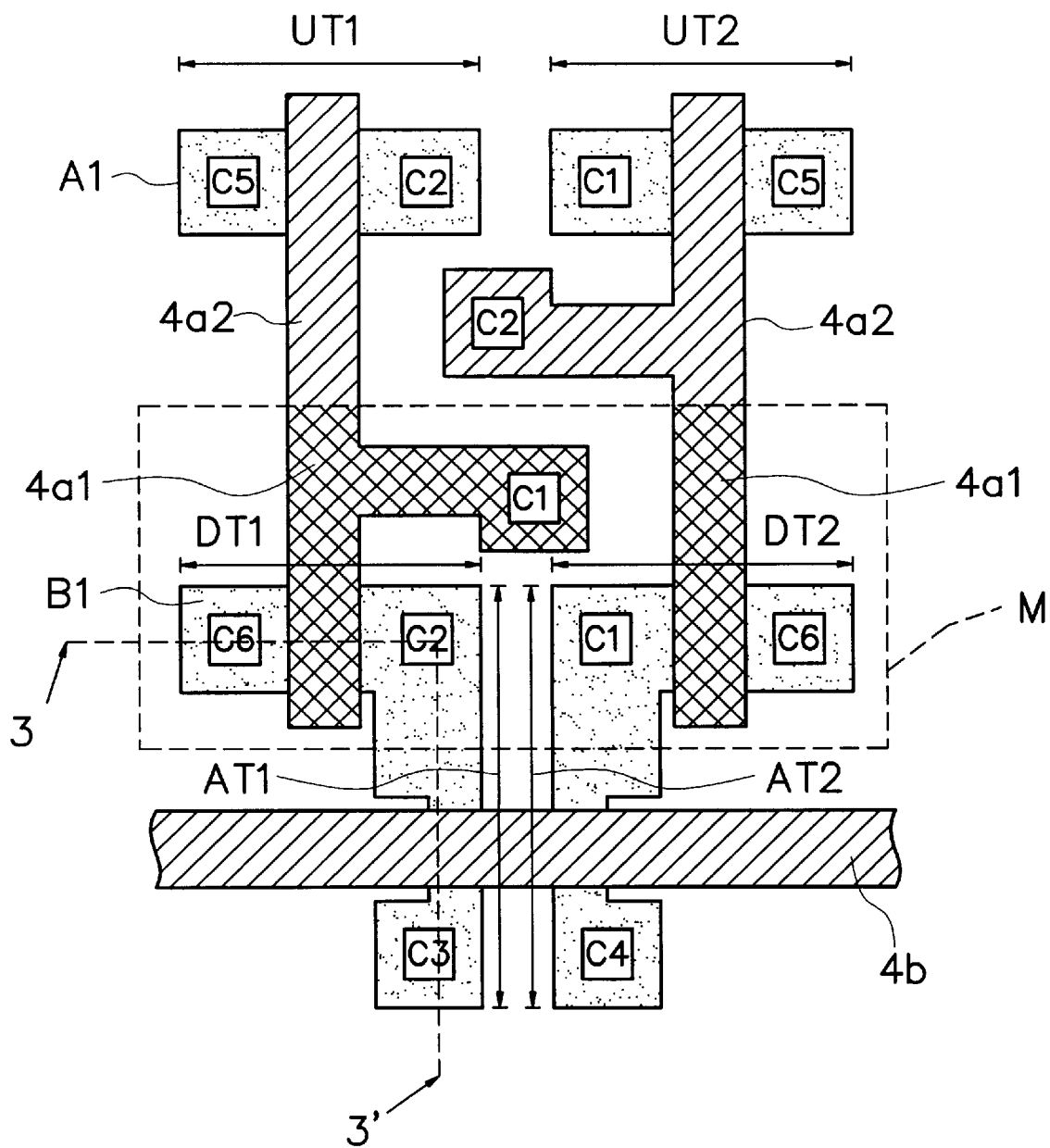
FIG. 2 is a schematic, top view of an SRAM layout in a preferred embodiment according to this invention.
Figure 3A:
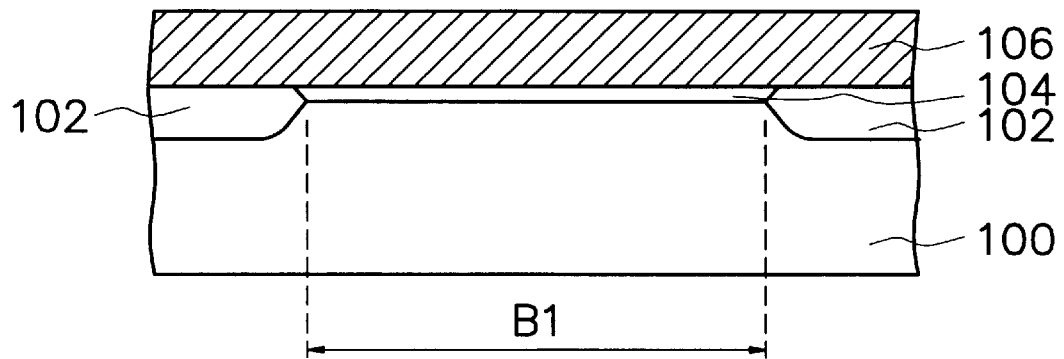
FIGS. 3A–3E are schematic, cross-sectional views taken along line 3–3' of FIG. 2, illustrating fabrication of an SRAM cell in a preferred embodiment according to this invention.

FIG. 2 shows a schematic, top view of an SRAM layout in a preferred embodiment according to this invention, and FIG. 3A–3E show cross-sectional views taken along line 3–3' to illustrate fabrication of an SRAM cell. Referring to FIG. 2 and FIG. 3A, an isolation structure 102 is formed on a substrate 100 such as silicon substrate. The isolation structure 102, which can be formed by local oxidation of silicon (LOCOS), for example, is used to define the active regions of the drive transistors DT1, DT2, the access transistors AT1, AT2, and the load transistors UT1, UT2.

Referring to FIG. 3A, a gate oxide layer 104 is thermally formed on the substrate 100. A polysilicon layer 106 with a thickness of 2500–3000 angstroms is formed on the gate oxide layer 104 by low pressure CVD (LPCVD).

Figure 3B:
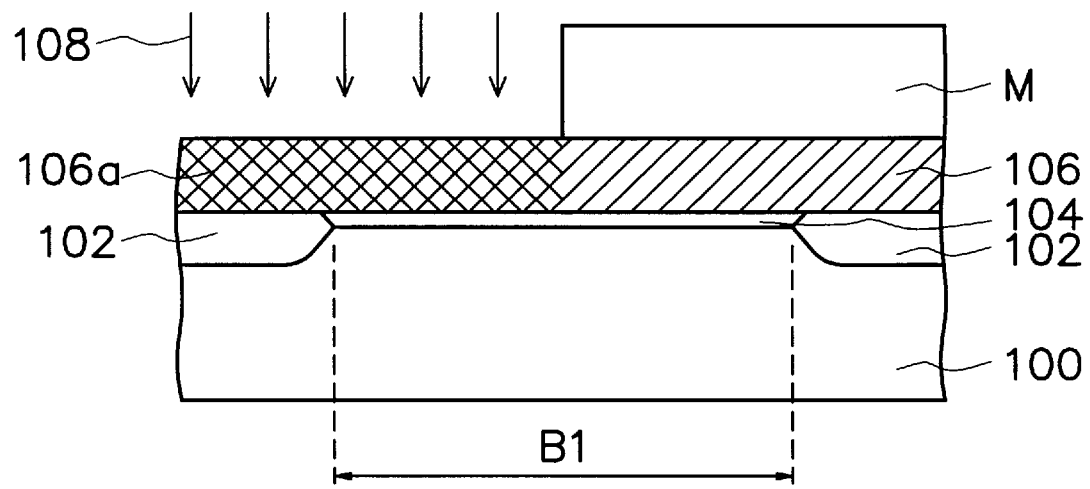

Referring to FIG. 2 and FIG. 3B, after deposition of the polysilicon layer 106, a mask M is formed to cover the polysilicon layer 106, except for the active regions of drive transistors DT1, DT2, i.e. the active regions of the access transistors AT1, AT2, and the load transistor UT1, UT2 are covered with the mask M. The mask M can be formed with a photomask by photolithography. Therefore, a predetermined region for the drive transistors DT1, DT2 is exposed. A germanium implantation 108 is performed on the exposed polysilicon layer 106 of the active regions of the drive transistors DT1, DT2. The germanium ions are doped into the polysilicon layer 106 of the active regions of the drive transistors DT1, DT2 to transform the exposed polysilicon layer 106 into a silicon germanium layer ($Si_xGe_{1-x}$) 106a. The energy and the dosage of the germanium ions depend on the thickness of the polysilicon layer 106 and the gate oxide layer 104.

Figure 3C:
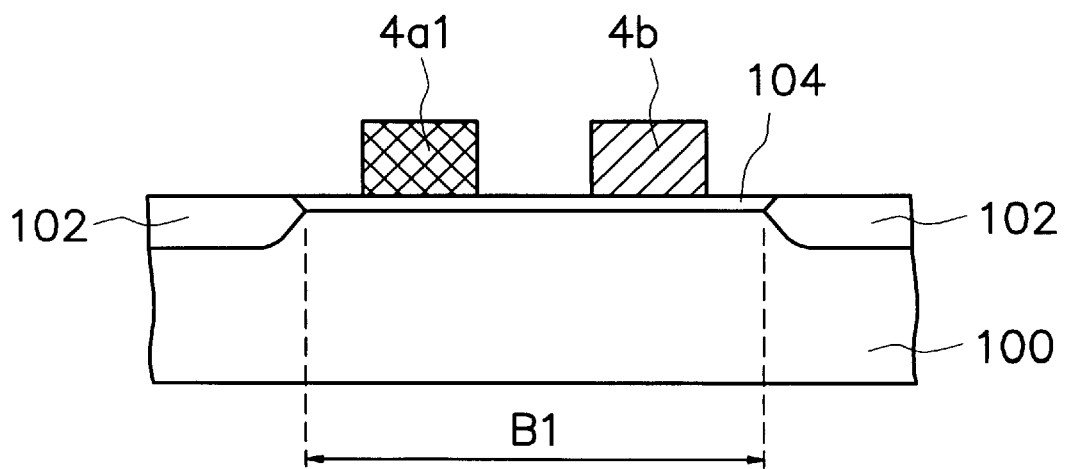

Thereafter, the mask M is removed. Photolithography is utilized to pattern the gate 4a1 of the drive transistors DT1, DT2, the gate 4a2 of the load transistors UT1, UT2, and the gate 4b of the access transistors AT1, AT2, as shown in FIG. 2 and FIG. 3C. Therefore, the gate 4a1 of the drive transistor DT1, DT2 is made with polysilicon germanium, and all of the gates 4a2, 4b of the load transistors UT1, UT2 and the access transistors AT1, AT2 are made of polysilicon.

Figure 3D:
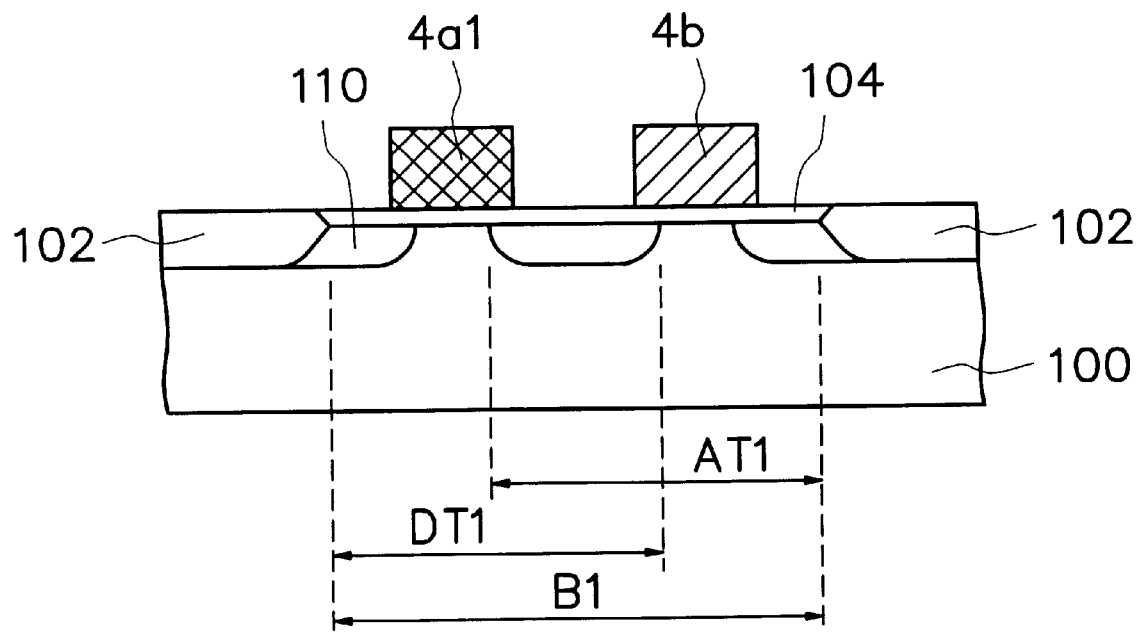
Figure 3E:
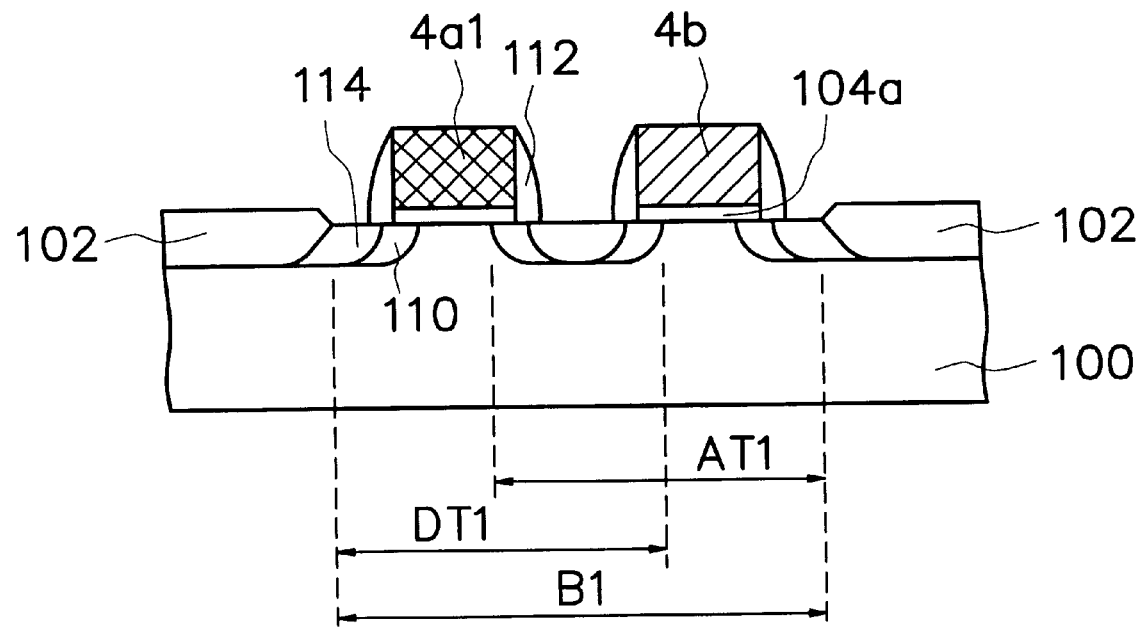

Referring to FIG. 3D, an ion implantation is performed on the substrate 100 to form an N⁻-doped region 110, which is used as an offset region in the substrate 100 beside the gates 4a1, 4b, and P-type impurities are implanted in the substrate 100 beside the gate 4a2 to form a P⁻-doped region. Referring to FIG. 3E, an insulating layer such as silicon oxide is then formed on the substrate 100. An anisotropic etching is performed on the insulating layer to form a spacer 112 on the gates 4a1, 4a2, 4b. An ion implantation is performed on the substrate 100 to form an N⁺-doped region 114 in the substrate 100 beside the spacer 112 of the gate 4a2. Therefore, the N-doped region 110, 114 serves as a source/drain region B1 of the access transistors AT1, AT2 and the drive transistors DT1, DT2, and the P-doped region is used as a source/drain region Al of the load transistors UT1, UT2.

The subsequent fabricating processes are achieved by conventional technology. Accordingly, as shown in FIG. 2, the load transistors UT1, UT2 are connected to VDD through a contact C5. The drive transistors DT1, DT2 are connected to VSS by a contact C6. The contacts that have the same mark are electrically connected to each other. In addition, load resistors can be substituted for load transistors.

This invention substitutes a polysilicon germanium gate for a polysilicon gate of the drive transistors in an SRAM, such that the gate depletion effect can be lessened. As a result, the current drive capability of the drive transistors is therefore enhanced and larger than that of the access transistors.

Moreover, since it is not necessary to consider the size of the gate for the drive transistors because the width/length ratio of the gate thereof is not increased, the integration density of SRAM can be raised.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a static random access memory adapted for a substrate having active regions of a drive transistor and an access transistor, comprising:

forming a gate oxide layer on the substrate;

forming a polysilicon layer on the gate oxide layer;

forming a polysilicon germanium layer on the active region of the drive transistor by germanium implantation;

forming a polysilicon germanium gate and a poly gate on the active regions of the drive transistor and the access transistor, respectively;

forming a lightly doped region in the substrate beside the polysilicon germanium gate and the poly gate;

forming a spacer on the sidewall of the polysilicon germanium gate and the poly gate; and forming a heavily doped region in the substrate beside the spacer.

2. The method according to claim 1, wherein the spacer is made of insulating materials.

3. The method according to claim 1, further comprising the step of performing an ion implantation when the germanium implantation is performed.

4. The method according to claim 3, wherein the ion implantation comprises N-type ions.

5. The method according to claim 1, wherein the lightly doped region and the heavily doped region comprise N-type impurities.

6. A method of fabricating a static random access memory adapted for a substrate having active regions of a drive transistor and an access transistor, comprising:

forming a gate oxide layer on the substrate;

forming a polysilicon layer on the gate oxide layer;

forming a mask on the substrate to at least cover the active region of the access transistor, so that the active region of the drive transistor is exposed;

performing a germanium implantation on the substrate to transfer a portion of the polysilicon layer into a polysilicon germanium layer;

patterning the polysilicon germanium layer and the polysilicon layer to respectively form a polysilicon germanium gate and a poly gate on the active regions of the drive transistor and the access transistor;

performing a light ion implantation on the substrate;

forming a spacer on the sidewall of the polysilicon germanium gate and the poly gate; and performing a heavy ion implantation on the substrate.

7. The method according to claim 6, wherein the spacer is made of insulating materials.

8. The method according to claim 6, further comprises the step of performing an ion implantation when the germanium implantation is performed.

9. The method according to claim 8, wherein the ion implantation comprises N-type ions.

10. The method according to claim 6, wherein the steps of performing a lighy ion implantation and a heavy ion implantation comprise N-type ions.

* * * * *